United States Patent
Vo et al.

(10) Patent No.: US 8,200,680 B2
(45) Date of Patent: *Jun. 12, 2012

(54) METHOD AND APPARATUS FOR WINDOWING IN ENTROPY ENCODING

(75) Inventors: Binh Dao Vo, Berkeley, NJ (US); Kiem-Phong Vo, Berkeley, NJ (US)

(73) Assignee: AT&T Intellectual Property II, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/069,366

(22) Filed: Mar. 22, 2011

(65) Prior Publication Data

US 2011/0173167 A1     Jul. 14, 2011

Related U.S. Application Data

(63) Continuation of application No. 11/871,391, filed on Oct. 12, 2007, now Pat. No. 7,925,639, which is a continuation of application No. 10/894,421, filed on Jul. 19, 2004, now Pat. No. 7,296,030.

(60) Provisional application No. 60/487,992, filed on Jul. 17, 2003.

(51) Int. Cl.
G06F 7/00 (2006.01)
G06F 17/30 (2006.01)

(52) U.S. Cl. .......................... 707/755; 707/756; 707/781

(58) Field of Classification Search .................. 707/755, 707/756, 781
See application file for complete search history.

(56) References Cited

U.S. PATENT DOCUMENTS

| | | | |
|---|---|---|---|
| 4,333,160 A | 6/1982 | Kobari et al. | |
| 4,823,201 A | 4/1989 | Simon et al. | |
| 5,081,675 A | 1/1992 | Kittirutsunetorn | |
| 5,104,091 A * | 4/1992 | Rathay et al. | 251/129.14 |
| 5,251,273 A * | 10/1993 | Betts et al. | 382/311 |
| 5,285,276 A | 2/1994 | Citta | |
| 5,295,159 A | 3/1994 | Kerpez | |
| 5,594,435 A | 1/1997 | Remillard | |
| 5,806,068 A | 9/1998 | Shaw et al. | |
| 5,838,834 A | 11/1998 | Saito | |
| 5,870,036 A | 2/1999 | Franaszek et al. | |
| 5,946,692 A | 8/1999 | Faloutsos et al. | |
| 6,031,671 A | 2/2000 | Ayres | |
| 6,122,379 A | 9/2000 | Barbir | |
| 6,198,773 B1 * | 3/2001 | Gill et al. | 375/240.26 |
| 6,249,902 B1 | 6/2001 | Igusa et al. | |
| 6,253,165 B1 | 6/2001 | Malvar | |
| 6,256,608 B1 | 7/2001 | Malvar | |
| 6,260,033 B1 | 7/2001 | Tatsuoka | |
| 6,263,444 B1 | 7/2001 | Fujita | |
| 6,301,571 B1 | 10/2001 | Tatsuoka | |
| 6,351,229 B1 | 2/2002 | Wang | |

(Continued)

OTHER PUBLICATIONS

Somendra M. Bhattacharjee—"Entropy and Perpetual Computers"—Institute of Physics, Bhubaneswar 751 005 India(Indian Academy of Sciences) Oct. 29, 2003 (pp. 1-9).*

(Continued)

*Primary Examiner* — John E Breene
*Assistant Examiner* — Anh Ly

(57) ABSTRACT

The present invention provides efficient window partitioning algorithms for entropy-encoding. The present invention enhances compression performance of entropy encoding based on the approach of modeling a dataset with the frequencies of its n-grams. The present invention may then employ approximation algorithms to compute good partitions in time $O(s*\log s)$ and $O(s)$ respectively, for any data segment S with length s.

15 Claims, 4 Drawing Sheets

U.S. PATENT DOCUMENTS

| | | |
|---|---|---|
| 6,381,628 B1 | 4/2002 | Hunt |
| 6,487,535 B1 | 11/2002 | Smyth et al. |
| 6,499,137 B1 | 12/2002 | Hunt |
| 6,653,954 B2 | 11/2003 | Rijavec |
| 6,667,700 B1 | 12/2003 | McCanne et al. |
| 6,959,300 B1 | 10/2005 | Caldwell et al. |
| 7,010,037 B2* | 3/2006 | Ye et al. ............ 375/240.1 |
| 7,017,043 B1 | 3/2006 | Potkonjak |
| 7,031,972 B2 | 4/2006 | Ren et al. |
| 7,039,581 B1* | 5/2006 | Stachurski et al. ......... 704/205 |
| 7,043,077 B2 | 5/2006 | Rijavec |
| 7,072,889 B2 | 7/2006 | Ogawa |
| 7,096,311 B2 | 8/2006 | Chiang |
| 7,139,700 B1* | 11/2006 | Stachurski et al. ......... 704/207 |
| 7,155,657 B2 | 12/2006 | Bordes et al. |
| 7,296,030 B2* | 11/2007 | Vo et al. ............ 707/693 |
| 7,925,639 B2* | 4/2011 | Vo et al. ............ 707/693 |
| 8,090,730 B2* | 1/2012 | Shahabi et al. ........... 707/756 |
| 2001/0004739 A1 | 6/2001 | Sekiguchi et al. |
| 2002/0010702 A1 | 1/2002 | Ajtai et al. |
| 2002/0169784 A1 | 11/2002 | Cha et al. |
| 2003/0009596 A1 | 1/2003 | Tonomura |
| 2003/0055833 A1 | 3/2003 | Chan et al. |
| 2003/0115041 A1 | 6/2003 | Chen et al. |
| 2003/0138045 A1 | 7/2003 | Murdock et al. |
| 2003/0140337 A1 | 7/2003 | Aubury |
| 2003/0149879 A1* | 8/2003 | Tian et al. ............ 713/176 |
| 2003/0167307 A1 | 9/2003 | Filepp et al. |
| 2003/0174897 A1 | 9/2003 | Le Leannec et al. |
| 2003/0233321 A1* | 12/2003 | Scolini et al. ............ 705/40 |
| 2004/0015768 A1 | 1/2004 | Bordes et al. |
| 2004/0028131 A1* | 2/2004 | Ye et al. ............ 375/240.11 |
| 2004/0039839 A1 | 2/2004 | Kalyanaraman et al. |
| 2004/0062130 A1 | 4/2004 | Chiang |
| 2004/0190635 A1 | 9/2004 | Ruehle |
| 2004/0221192 A1 | 11/2004 | Motta et al. |
| 2005/0192994 A1* | 9/2005 | Caldwell et al. ............ 707/101 |
| 2005/0198056 A1 | 9/2005 | Dumais et al. |
| 2005/0210056 A1 | 9/2005 | Pomerantz et al. |
| 2007/0165717 A1* | 7/2007 | Ye ............ 375/240.16 |

OTHER PUBLICATIONS

Watanabe et al.—"Map Generation from Aerial Imagery using Data Compression"—Proc. MVA2000, 2000—mva-org.jp IAPR: Working on Machine Vision Applications, Nov. 28-30, 2000, The University of Tokyo, Japan (pp. 596-599).*

Edward Mingjun Yan—"Minimizing bandwidth requirement of broadcasting protocol in video-on-demand services"—Mar. 2002, (pp. 1-106).

Wang et al.—"Review of error resilient coding techniques for real-time video communications" IEEE signal processing 2000, (pp. 1-47).

Alajaji et al.—"An unequal error protection trellis coding scheme for still image communication"—Information theory, 1997, IEEE International symposium Jun. 29-Jul. 4, 1997 (p. 447, one page only).

Salvatore T. March—"Techniques for Structuring Database records"—Computer Science, vol. 15, No. 1, Mar. 1983 (pp. 45-79) (ACM Computing Surveys (CSUR).

David Andrew Douglas Tompkins—"Rate Control in Bi-Level Image Coding"—Aug. 2000, The university of Britsh Columbia (pp. 1-152).

Lekatsas et al.—"CoCo: A hardware/Software Platform for Rapid Prototyping of Code Compression technologies"—Proceedings of the 40.sup.th Annual Design Automation Conference (ACM—IEEE) DAC 2003, Jun. 2-6, 2003 Anaheim, California, USA (pp. 306-311).

Shapira et al., "In-Place Differential File Compression of Non-Aligned Files with Applications to File Distribution, Backups, and String Similarity", Mar. 23, 2004, Data Compression Conference 2004, IEEE Press, pp. 1-10.

Van Hoff et al., Generic Diff Format Specification, Aug. 25, 1997, W3C.org, pp. 1-4, http://www.w3.org/TR/NOTE-gdiff-19970825.html.

Korn et al., "Engineering a Differencing and Compression Data Format", Nov. 3, 2002, USENIX Conference, ACM, pp. 1-10.

Vo et al., "Using Column Dependency to Compress Tables", Mar. 23, 2004, Data Compression Conference 2004, IEEE Press, pp. 1-10.

Liefke et al., "XMill: an Efficient Compressor for XML Data", May 14, 2000, Proc. of SIGMOD, ACM, pp. 1-12.

Burrows et al., "A Block-sorting Lossless Data Compression Algorithm", May 10, 1994, Digital Systems Research Center, pp. 1-18.

Buchsbaum et al., "Improving Table Compression with Combinatorial Optimization", Jan. 2002, Proc 13.sup.th ACM-SIAM Symposium on Discrete Algorithms, pp. 1-10.

Hunt et al., "Delta Algorithms: An Empirical Analysis", 1998, ACM Transactions on Software Engineering and Methodology, vol. 7, pp. 192-214.

Buchsbaum et al., Engineering the Compression of Massive Tables: An Experimental Approach, Jan. 9, 2000, Proc. 11.sup.th ACM-SIAM Symp. of Discrete Algorithms, pp. 1-10.

Korn et al., "The VCDIFF Generic Differencing and Compression Data Format", Jun. 2002, RFC 3284, Standards Track, pp. 1-29.

Xu et al., "A Brief Survey of Program Slicing", Mar. 2004, ACM SIGSOFT Software Engineering Notes, vol. 30, No. 2, pp. 1-36.

Mogul et al., "Potential Benefits of Delta Encoding and Data Compression for HTTP (Corrected Version)", Dec. 1997, WRL Research Report 97/4a, Digital Western Research Laboratory, pp. 1-50.

Huffman, "A Method for the Construction of Minimum-Redundancy Codes", Sep. 1952, Proceedings of the IRE, vol. 40, No. 9, pp. 1098-1101.

Fiala, et al., "Data Compression with Finite Windows", Communications of ACM, vol. 32, issue 4, Apr. 1998, pp. 490-505.

Ajtai, et al., "Compacting Encoding Unstructured Inputs with Differential Compression", May 2002, Journal of the ACM, vol. 49, No. 3, pp. 318-327, 330-331, 337, 362-363.

Klein, "Efficient Recompression Techniques for Dynamic Full-Text Retrieval Systems", Jul. 13, 1995, Proceedings of SIGIR '95, ACM Press, pp. 39-47.

Muthitacharoen, et al., "A Low-bandwidth Network File System", ACM Symposium on Operating Systems SIGOPS, Oct. 2001, ACM Press, pp. 174-187.

Fukumoto, et al., "An Automatic Extraction of Key Paragraphs Based on Context Dependency", Mar. 1997, Proceedings of the Fifth Conference on Applied Natural Language Processing, Morgan Kaufmann Publishers, pp. 291-298.

Kukich, "Techniques for Automatically Correcting Words in Text", Dec. 1992, ACM Computing Surveys, vol. 24, No. 4, pp. 377-439.

* cited by examiner

METHOD AND APPARATUS FOR WINDOWING IN ENTROPY ENCODING

This application is a continuation of U.S. patent application Ser. No. 11/871,391 filed Oct. 12, 2007, now U.S. Pat. No. 7,925,639 B2, entitled Method and Apparatus for Windowing in Entropy Encoding, which is a continuation of U.S. patent application Ser. No. 10/894,421 filed Jul. 19, 2004, now U.S. Pat. No. 7,296,030 B2, entitled Method And Apparatus For Windowing In Entropy Encoding, which claims the benefit of U.S. Provisional Application Ser. No. 60/487,992 filed on Jul. 17, 2003, each of which is herein incorporated by reference.

The present invention relates generally to data compression and, more particularly, to a method for efficient window partition identification in entropy encoding to enhance compression performance of entropy encoding based on the idea of modeling a dataset with the frequencies of its n-grams.

BACKGROUND OF THE INVENTION

Compression programs routinely limit the data to be compressed together in segments called windows. The process of doing this is called windowing. String-based compression techniques such as Lempel-Ziv or Burrows-Wheeler often use fixed-size windows suitable for in-core processing. Entropy-encoding techniques such as Huffman or arithmetic compression normally do not require windowing except to bound code lengths or to avoid reading large files multiple times. However, these compressors can benefit from windowing when the statistical models change in different file regions. For example, consider a data file made up from four letters in which two letters appear exclusively in the first half of the file while the other two letters appear exclusively in the second half. If all letters appear with the same frequency, a Huffman compressor would normally encode each letter with two bits. On the other hand, each letter can be encoded with a single bit if each half of the file is treated separately. Adaptive techniques such as adaptive Huffman or splay tree do encode data with shifting models but they often produce inferior codes and incur larger costs in both compression and uncompression times than static Huffman.

Therefore, a need exists for a method for efficient window partition identification in entropy encoding, e.g., with performance much better than $O(s^3)$ time.

SUMMARY OF THE INVENTION

In one embodiment, the present invention significantly improves the performance of identifying window partitions in entropy encoding. In particular, the present invention, enhances compression performance of entropy encoding based on the idea of modeling a dataset with the frequencies of its n-grams and employs two approximation algorithms to compute good partitions in time $O(s*\log s)$ and $O(s)$ respectively, for any data segment S with length s.

BRIEF DESCRIPTION OF THE DRAWINGS

The teaching of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
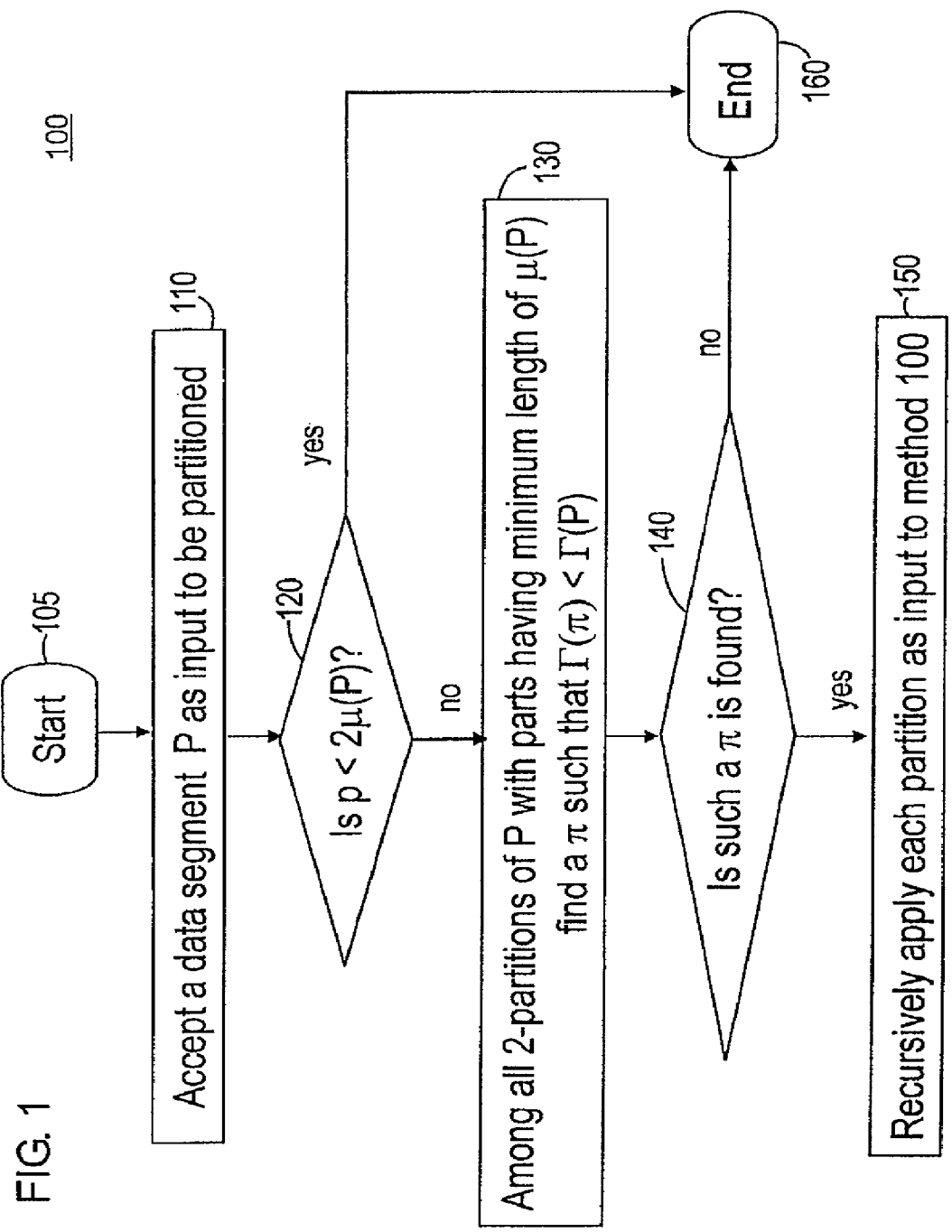
FIG. 1 illustrates a flowchart of a partitioning method of the present invention for recursively partitioning a given data segment into smaller segments that can be compressed separately.

The present invention relates to data compression using entropy encoding based on the idea of modeling a dataset with the frequencies of its n-grams.

To better understand the present invention, a description of n-grams and its use are first provided. The present invention uses n-grams to model data. For any data segment S with length s, an n-gram in S is a subsequence of n<s consecutive bytes. Assume an arbitrary but fixed n, the notation $S_i$ will denote the n-gram in S starting at location i while S[i] denotes the byte at location i. For example, the string S=ababac is of length 8 and has five 4-grams, of which three are distinct: abab, baba and abac. The 4-grams $S_0$ and $S_2$ are the same: abab.

In one embodiment, the present invention repeatedly examine n-gram frequencies of given data segments. Thus, it is beneficial if this step can be executed quickly. For any general data segment S, the notation $F_S$ shall be used to denote an associative array of frequencies indexed by the n-grams of S. Suppose that $F_S$ was initialized to 0's, the below loop computes all n-gram frequencies:

for($i=0;i<=s-n;i+=1$)

$F_S[S_i]+=1;$

This loop runs in time O(s) as long as the cost of indexing the array $F_S$ can be bounded by some constant. This can be ensured by implementing $F_S$ as a hash table indexed by the distinct n-grams. However, hash table look-up cost is significant and the frequency estimates do not always need to be exact. Thus, $F_S$ is chosen to be implemented as a normal array of size A by hashing each n-gram $S_i$ to an integer via the below hash function with some preselected constant $\alpha$:

$$\chi(S_i)=(\alpha^{n-1}S[i]+\alpha^{n-2}S[i]+\ldots+S[i+n-1]) \bmod A \quad \text{(Equ. 1)}$$

The above loop then becomes:

for($i=0;i<=s-n;i+=1$)

$F_S[\chi(S_i)]+=1;$

For nontrivial values of n, the loop can be further optimized by exploiting the linearity of the hash function $\chi$ to compute $\chi(S_{i+1})$ from $\chi(S_i)$ via:

$$\chi(S_{i+1})=\{\alpha(\chi(S_i)-\alpha^{n-1}S[i])+S[i+n]\} \bmod A \quad \text{(Equ. 2)}$$

Computing frequencies of 1-grams or single letters is, of course, the basis for Huffman and arithmetic coders. For entropy-encoding compressors, n=1 so A=256 would allow $F_S$ to index all possible 8-bit bytes at no loss of accuracy. Henceforth, given a data segment S and a frequency array $F_S$, it shall be assumed that $F_S$ is indexed by mapping the n-grams via the $\chi$ function as described. Therefore, the notation $F_S[S_i]$ will mean $F_S[\chi(S_i)]$.

Entropy-encoding compressors such as Huffman and arithmetic coders compress data based on modeling the probability of symbols which would be 1-grams or bytes. Although these compressors are sensitive to changes in symbol statistics, they often cannot adapt to evolution in the statistical models. Certain adaptive versions of these algorithms can cope with some model changes but tend to produce less efficient codes and have longer running time. Overall, none of these schemes work well when the statistical models abruptly change. For example, Buchsbaum et al. developed a dynamic programming solution to the problem of grouping columns in large tables to enhance compression. In entropy encoding application with any data segment S with s bytes in length, since each byte is treated as a column, the algorithm can be used to compute an optimal partition in $O(s^3)$ time. This is too slow for large datasets with size in the megabytes.

To address this criticality, the present invention provides two methods for computing good partitions using approximations, with significant performance enhancements, in $O(s*\log s)$ and $O(s)$ time respectively. This also means that there is good potential gain in finding a good partition of the data into sections with sufficiently different symbol statistics using the present invention, then applying the compressors to each section separately.

Let S be a data segment of length s. A partition $\pi$ of S with k parts divides S into a sequence of consecutive non-overlapping sub-segments $(P_1, P_2, \ldots P_k)$ that together exactly cover S. A partition with k parts is referred as a k-partition. For a given compressor $\Gamma$ and a data segment P, let $\Gamma(P)$ be the compressed length of P. Then, the compressed length of any partition $\pi$ of S with k parts is:

$$\Gamma(\pi) = \sum_{i=1}^{k} \Gamma(P_i) \qquad \text{(Equ. 3)}$$

FIG. 1 illustrates a flowchart of a partition method 100 of the present invention for recursively partitioning a given data segment into smaller segments that can be compressed separately computation complexity of $O(s\log s)$ time. Method 100 starts in step 105 and proceeds to step 110.

In step 110, a data segment P is accepted as input to be partitioned. In step 120, the length of segment P, p, is checked if it is smaller than $2*\mu(P)$. If p is smaller than $2*\mu(P)$, then the method terminates in step 160; otherwise, the method proceeds to step 130.

Figure 2:
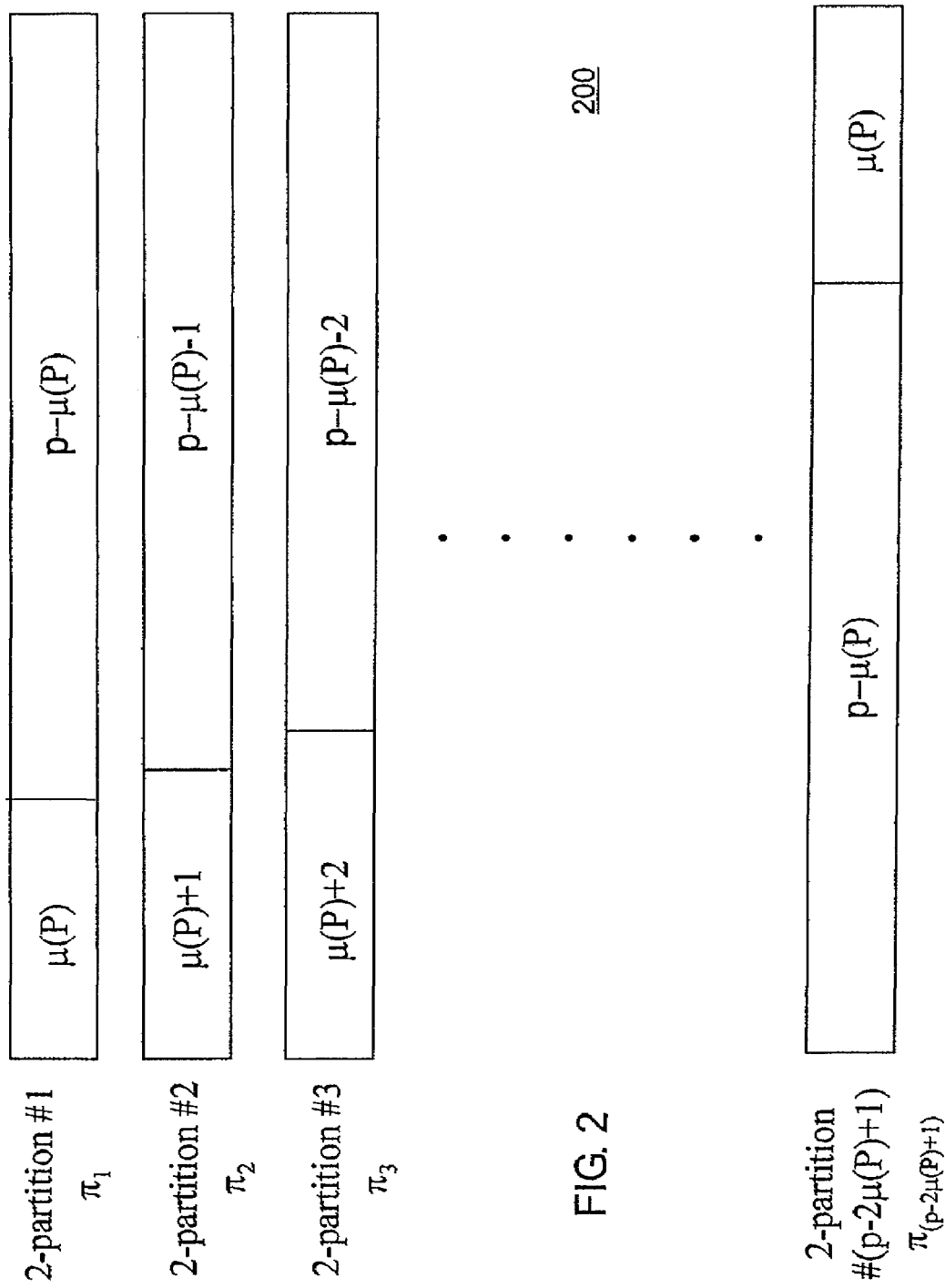
FIG. 2 illustrates an example of all possible 2-partitions of a data segment P, having length p, with parts having length at least $\mu(P)$ long.

In step 130, among all 2-partitions of P with both partitions having length at least $\mu(P)$, find a it such that $\Gamma(\pi)<\Gamma(P)$. In general, for a segment P with length p with parts having length at least $\mu(P)$ in length, there will be a total of $(p-2\mu(P)+1)$ 2-partitions. FIG. 2 illustrates the possible combinations of 2-partitions for a segment P with parts having length at least $\mu(P)$ in length. Each 2-partition contains a left and a right partition. In the first combination, $\mu_1$, the left partition have length $\mu(P)$ and the right partition have length $p-\mu(P)$. In the second combination, $\pi_2$, the left partition have length $\mu(P)+1$ and the right partition have length $p-\mu(P)-1$. In the third combination, $\pi_3$, the left partition have length $\mu(P)+2$ and the right partition have length $p-\mu(P)-2$. Following this pattern, in the last combination, $\pi_{p-2\mu(P)+1}$, which is the $(p-2\mu(P)+1)$th combination, the left partition have length $p-\mu(P)$ and the right partition have length $\mu(P)$. Therefore, in step 130, among all possible 2-partition combinations for a segment P with parts having length at least $\mu(P)$ in length, the method calculates $\Gamma(\pi)=$ $$\Gamma(\pi) = \sum_{i=1}^{k} \Gamma(P_i)$$

based on Equ. 3 and check if the condition $\Gamma(\pi)<\Gamma(P)$ is true for each 2-partition.

In step 140, if a 2-partition that meets the condition of $\Gamma(\pi)<\Gamma(P)$, then the method proceeds to step 150. It is possible that more than one 2-partitions, $\pi$, can be found to meet such condition. In that case, the choice of a good $\pi$ is arbitrary and depends on the applications of the algorithm. In one embodiment of the present invention, the good $\pi$ used can simply be the first it found among all 2-partitions. If a 2-partition cannot be found to meet the condition of $\Gamma(\pi)<\Gamma(P)$ among all 2-partitions, then the method terminates in step 160.

In step 150, for the chosen 2-partition that meet the condition of $\Gamma(\pi)<\Gamma(P)$, the method recursively and independently uses the left partition and the right partition as inputs to method 100.

In one embodiment of the present invention, $\mu(P)$ is chosen to be equal to $\max(p/5, \epsilon)$, where p is the length of P and $\epsilon=2^{12}$, i.e. 4K bytes. This function is used to determine the minimum length of a partition since small data segments compress poorly. By requiring $\mu(P)$ to be a fixed fraction of the length of P, the depth of the recursion of method 100 can be bounded by $O(\log s)$. Then, the entire algorithm runs in $O(\gamma s\log s)$ time where s is the length of the original data segment S and $\gamma$ is an estimation of the cost to compute the compressed length function $\Gamma$ on the parts of the candidate partitions.

For a general compressor, the only way to compute $\Gamma$ might be to invoke the compressor on the data itself and measure the result. In that case $\gamma$ might be up to $O(s)$. For entropy-encoding compressors, it is possible to define an estimation function with constant time amortized cost. Consider a data segment P of length p at any recursion level in method 100. Let $F_p$ the corresponding array of byte frequencies. Shannon's information theory asserts that the number of bits required to encode a byte i with respect to the data in P is $\log(p/F_P[i])$ since $F_P[i]/p$ is the empirical probability of i. Let $\tau$ be an estimate for the length of a table of codes or frequencies that a static Huffman or arithmetic compressor would need to decode data. Then, the compressed length of P, $\Gamma_e(P)$, can be estimated with:

$$\Gamma_e(P) = \tau + \sum_{i=0}^{255} F_P[i] \log\left(\frac{p}{F_P[i]}\right) \qquad \text{(Equ. 4)}$$
$$= \tau + p\log p - \sum_{i=0}^{255} F_P[i] \log(F_P[i])$$

In one embodiment of the present invention, $\tau=5b(256-b)$ where b is the number of bytes with non-zero frequency. The factor of 5 was chosen because the Huffman encoder used in one embodiment of the present invention guarantees maximal code length 32. The term 256−b estimates the space needed to encode the bytes not appearing in the data, i.e., having zero code length.

Now, let $\pi 1=(P_1, P_2)$ and $\pi 2=(Q_1, Q_2)$ be two 2-partitions of P such that $Q_1$ is formed by extending $P_1$ by one byte on the right. Then $Q_2$ must have been formed by cutting one byte from the left of $P_2$. Since only a single byte leaves a part or gets added to it, the frequency arrays $F_{P_1}$ and $F_{P_2}$ can be updated in constant time to form $F_{Q_1}$ and $F_{Q_2}$. As a consequence, $\Gamma_e(\pi_2)$ can be computed in constant time from $\Gamma_e(\pi_1)$.

Since all 2-partitions of can be generated by exchanging bytes in a loop starting from the partition ($\phi$, P), where $\phi$ is a null data segment, step 130 of method 100 can be implemented so that the total running time of all invocations of the compressed length function $\Gamma_e$ is O(p). Thus, the amortized cost of each $\Gamma_e$ is constant. Further, since each recursion level of method 100 only needs two frequency arrays in the computing loop, the required space for method 100 at all recursion levels is bounded by O(log s). Putting everything together, method 100 can be implemented in O(slog s) time and O(s+logs) space where s is the length of the data segment to be partitioned.

Figure 3:
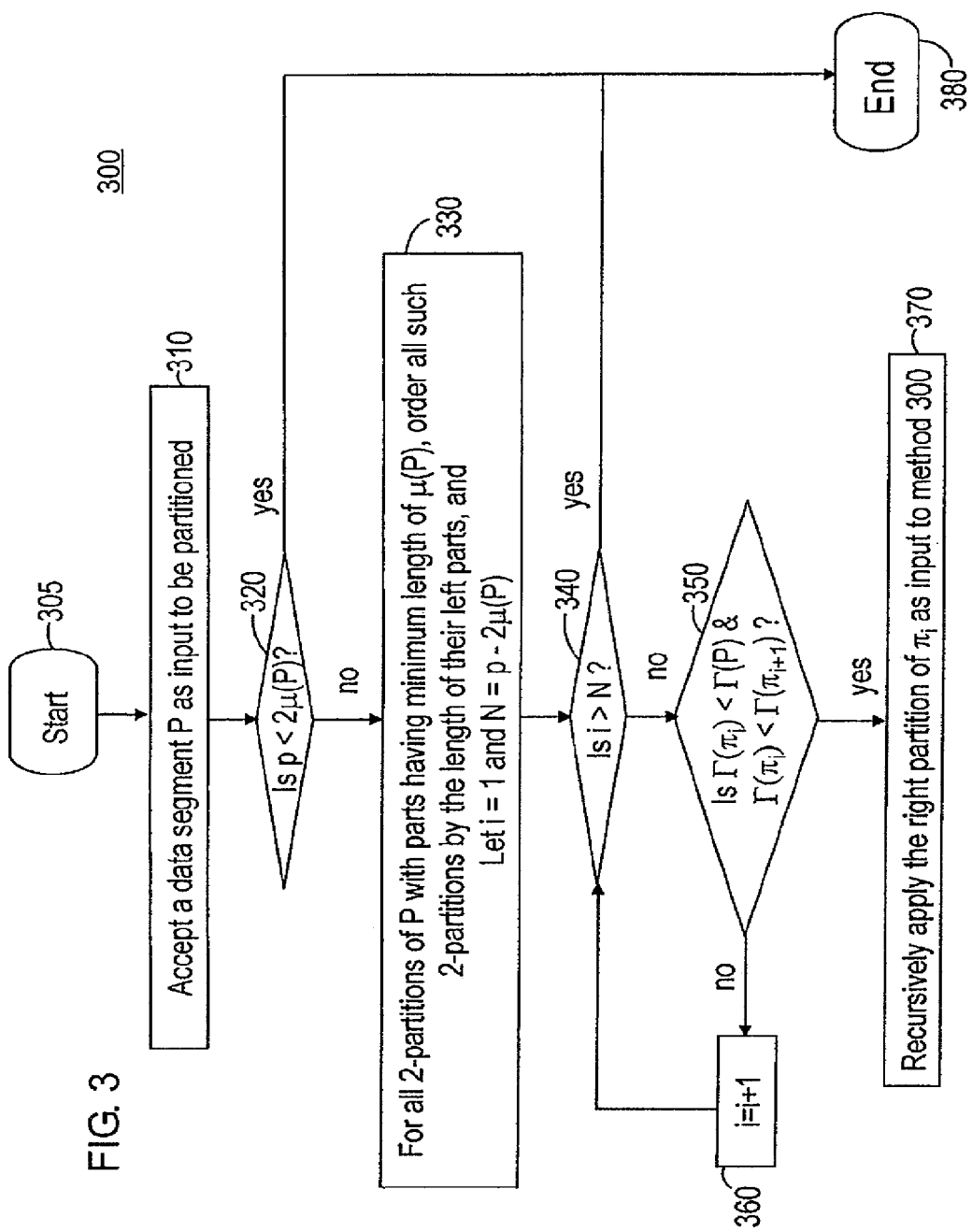
FIG. 3 illustrates a flowchart of a faster variation of partitioning method of the present invention for recursively partitioning a given data segment into smaller segments that can be compressed separately.

For a slight loss in compression performance, it is possible to eliminate the factor log s from the time complexity of method 100. FIG. 3 illustrates a flowchart of a faster partition method 300 of the present invention for recursively partitioning a given data segment into smaller segments that can be compressed separately with computation complexity of O(s) time. Method 300 starts in step 305 and proceeds to step 310.

In step 310, a data segment P is accepted as input to be partitioned. In step 320, the length of segment P, p, is checked if it is smaller than 2*$\mu$(P). If p is smaller than 2$\mu$(P), then the method terminates in step 380; otherwise, the method proceeds to step 330.

In step 330, all 2-partitions with parts having minimum length of $\mu$(P) are first ordered by the length of their left parts. FIG. 2 illustrates an example of the outcome of such an ordering step. In general, for a segment P with length p with parts having length at least $\mu$(P) in length, there will be a total of (p−2$\mu$(P)+1) 2-partitions. In the first 2-partition, $\pi_1$, the left partition have length $\mu$(P) and the right partition have length p−$\mu$(P). In the second 2-partition, $\pi_2$, the left partition have length $\mu$(P)+1 and the right partition have length p−$\mu$(P)−1. In the third 2-partition, $\pi_3$, the left partition have length $\mu$(P)+2 and the right partition have length p−$\mu$(P)−2. Following this pattern, in the last 2-partition, $\pi_{p-2\mu(P)+1}$, which is the (p−2$\mu$(P)+1)th 2-partition, the left partition have length p−$\mu$(P) and the right partition have length $\mu$(P). Then, step 330 initializes the variables i to 1 and N to p−2$\mu$(P).

In step 340, if i is greater than N, then the method terminates in step 380; otherwise, the method proceeds to step 350. In step 350, if $\Gamma(\pi_i)<\Gamma(P)$ and $\Gamma(\pi_{i+1})>\Gamma(\pi_i)$, then the method proceeds to step 370; otherwise, the method proceeds to step 360. In step 360, the method increments i by 1 and the proceeds back to step 340. In step 370, the method recursively apply the right partition of $\pi_i$ as input to method 300.

The basic idea behind method 300 is to consider all 2-partitions of S in order starting from ($\phi$, S), where $\phi$ is a null data segment. When a partition is found that improves over the encoding of the entire data segment, it is simply split off from its left part, then used to iterate on the rest. The machinery developed earlier to update frequency arrays can be applied straightforwardly here so that method 300 can be implemented in O(s) time and space where s is the length of the data segment to be partitioned.

Figure 4:
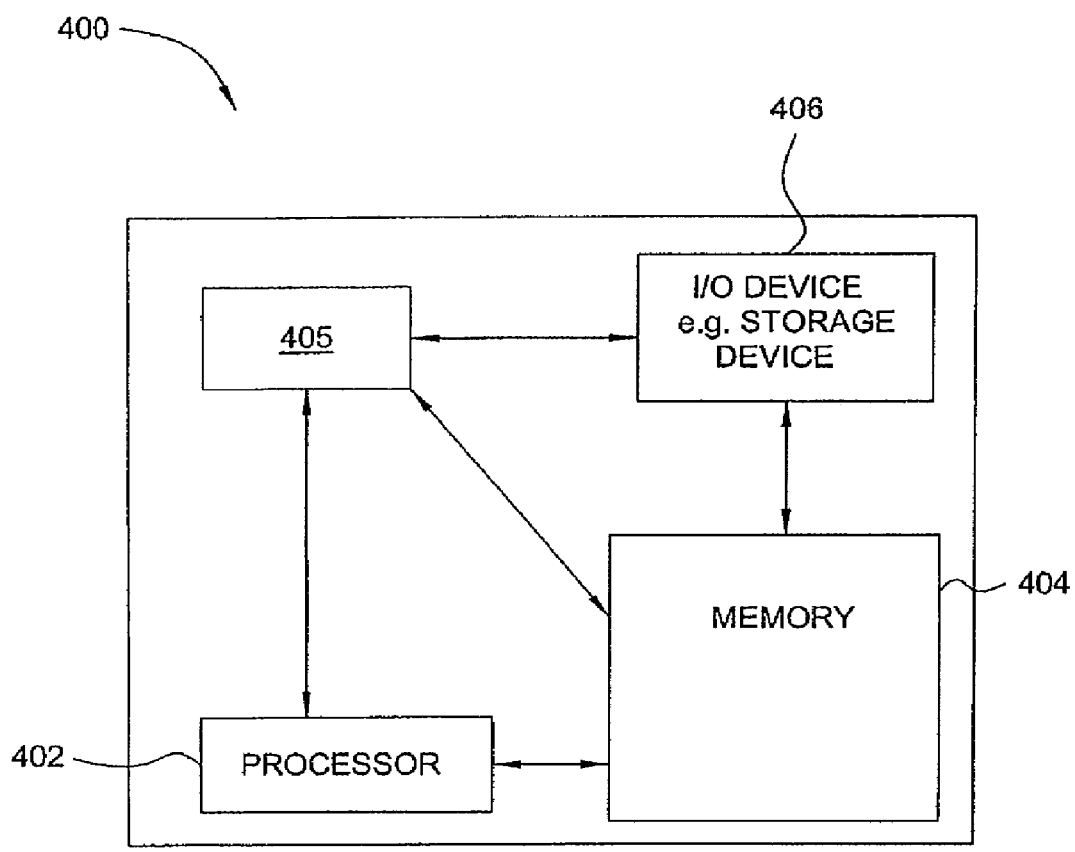
FIG. 4 illustrates the present partitioning method implemented using a general purpose computer or any other hardware equivalents.

FIG. 4 illustrates the present partitioning method implemented using a general purpose computer 400 or any other hardware equivalents. For example, the present partitioning methods and data structures can be represented by one or more software applications (or even a combination of software and hardware, e.g., using application specific integrated circuits (ASIC)), where the software is loaded from a storage medium 406, (e.g., a ROM, a magnetic or optical drive or diskette) and operated by the CPU 402 in the memory 404 of the system. As such, the present partitioning methods and data structures of the present invention can be stored on a computer readable medium, e.g., RAM memory, ROM, magnetic or optical drive or diskette and the like.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for partitioning a data segment, P, with a length p into smaller segments, $P_i$, wherein each of the smaller segments is compressed separately, the method comprising:
    storing the data segment, P in a computer readable storage medium;
    dividing the data segment, P into a plurality of 2-partition pairs $\pi$ where both partitions within each pair have a predefined length of at least $\mu$(P);
    estimating a compressed length of each partition within each pair; and
    selecting one of the 2-partition pairs it for partitioning the data segment, P, such that $\Gamma(\pi)<\Gamma(P)$, where $\Gamma(\pi)$ represents a compressed length of the one of the 2-partition pairs and $\Gamma(P)$ represents a compressed length of the data segment, P, wherein at least one of: the storing, the dividing, the estimating or the selecting is performed via a processor.

2. The method of claim 1, wherein the compressed length of the data segment is estimated using a function of:

$$\Gamma_e(P) = \tau + \sum_{i=0}^{255} F_p[i]\log\left(\frac{p}{F_p[i]}\right) = \tau + p\log p - \sum_{i=0}^{255} F_p[i]\log(F_p[i])$$

where $F_P[i]$ is a corresponding array of frequencies for a byte i and $\pi$ is an estimate for a length of a table of codes or frequencies that a static Huffman or arithmetic compressor needs to decode data.

3. The method of claim 1, where $$\Gamma(\pi) = \sum_{i=1}^{k} \Gamma(P_i)$$

and $\mu$(P)=max(p/5, $\epsilon$) and $\epsilon$ is an arbitrary parameter.

4. The method of claim 1, further comprising:
    ordering the 2-partition pairs by a length of the left parts of the 2-partition pairs, for all 2-partition pairs of P with parts having a minimum length of $\mu$(P), where $\mu$(P)=max (p/5, $\epsilon$) and $\epsilon$ is an arbitrary parameter; and
    finding a $\pi_i$ such that $\Gamma(\pi_i)<\Gamma(P)$ and $\Gamma(\pi_{i+i})>\Gamma(\pi_i)$.

5. The method of claim 4, wherein the finding comprises:
    when the $\pi_i$ is found, then recursively applying a right partition associated with the $\pi_i$.

6. A computer-readable storage medium having stored thereon a plurality of instructions, the plurality of instructions including instructions which, when executed by a processor, cause the processor to perform a method for partitioning a data segment, P, with a length p into smaller segments, $P_i$, wherein each of the smaller segments is compressed separately, comprising:
    storing the data segment, P in a computer readable storage medium;
    dividing the data segment, P into a plurality of 2-partition pairs $\pi$ where both partitions within each pair have a predefined length of at least $\mu$(P);
    estimating a compressed length of each partition within each pair; and selecting one of the 2-partition pairs π for partitioning the data segment, P, such that $\Gamma(\pi)<\Gamma(P)$, where $\Gamma(\pi)$ represents a compressed length of the one of the 2-partition pairs and $\Gamma(P)$ represents a compressed length of the data segment, P.

7. The computer-readable storage medium of claim 6, wherein the compressed length of the data segment is estimated using a function of:

$$\Gamma_e(P) = \tau + \sum_{i=0}^{255} F_p[i]\log\left(\frac{p}{F_p[i]}\right)$$
$$= \tau + p\log p - \sum_{i=0}^{255} F_p[i]\log(F_p[i])$$

where $F_P[i]$ is a corresponding array of frequencies for a byte i and τ is an estimate for a length of a table of codes or frequencies that a static Huffman or arithmetic compressor needs to decode data.

8. The computer-readable storage medium of claim 6, where $$\Gamma(\pi) = \sum_{i=1}^{k} \Gamma(P_i)$$

and $\mu(P)=\max(p/5, \epsilon)$ and ε is an arbitrary parameter.

9. The computer-readable storage medium of claim 6, further comprising:
   ordering the 2-partition pairs by a length of the left parts of the 2-partition pairs, for all 2-partition pairs of P with parts having a minimum length of $\mu(P)$, where $\mu(P)=\max(p/5, \epsilon)$ and ε is an arbitrary parameter; and
   finding a $\pi_i$ such that $\Gamma(\pi_i)<\Gamma(P)$ and $\Gamma(\pi_{i+1})>\Gamma(\pi_i)$.

10. The computer-readable storage medium of claim 9, wherein the finding comprises:
   when the $\pi_i$ is found, then recursively applying a right partition associated with the $\pi_i$.

11. An apparatus for performing a method for partitioning a data segment, P, with a length p into smaller segments, $P_i$, wherein each of the smaller segments is compressed separately, comprising:
   a processor; and
   a computer-readable medium in communication with the processor, wherein the computer-readable medium having stored thereon a plurality of instructions, the plurality of instructions including instructions which, when executed by the processor, cause the processor to perform a method, comprising:
   storing the data segment, P in a computer readable storage medium;
   dividing the data segment, P into a plurality of 2-partition pairs π where both partitions within each pair have a predefined length of at least $\mu(P)$;
   estimating a compressed length of each partition within each pair; and
   selecting one of the 2-partition pairs π for partitioning the data segment, P, such that $\Gamma(\pi)<\Gamma(P)$, where $\Gamma(\pi)$ represents a compressed length of the one of the 2-partition pairs and $\Gamma(P)$ represents a compressed length of the data segment, P.

12. The apparatus of claim 11, wherein the compressed length of the data segment is estimated using a function of:

$$\Gamma_e(P) = \tau + \sum_{i=0}^{255} F_p[i]\log\left(\frac{p}{F_p[i]}\right)$$
$$= \tau + p\log p - \sum_{i=0}^{255} F_p[i]\log(F_p[i])$$

where $F_P[i]$ is a corresponding array of frequencies for a byte i and τ is an estimate for a length of a table of codes or frequencies that a static Huffman or arithmetic compressor needs to decode data.

13. The apparatus of claim 11, where $$\Gamma(\pi) = \sum_{i=1}^{k} \Gamma(P_i)$$

and $\mu(P)=\max(p/5, \epsilon)$ and ε is an arbitrary parameter.

14. The apparatus of claim 11, further comprising:
   ordering the 2-partition pairs by a length of the left parts of the 2-partition pairs, for all 2-partition pairs of P with parts having a minimum length of $\mu(P)$, where $\mu(P)=\max(p/5, \epsilon)$ and ε is an arbitrary parameter; and
   finding a $\pi_i$ such that $\Gamma(\pi_i)<\Gamma(P)$ and $\Gamma(\pi_{i+1})>\Gamma(\pi_i)$.

15. The apparatus of claim 14, wherein when the $\pi_i$ is found, recursively applying a right partition associated with the $\pi_i$.

* * * * *